(12) United States Patent
Lee

(10) Patent No.: US 10,074,961 B2
(45) Date of Patent: Sep. 11, 2018

(54) LASER DRIVER CIRCUIT AND METHOD OF OPERATING THEREOF

(71) Applicant: STMICROELECTRONICS (RESEARCH & DEVELOPMENT) LIMITED, Marlow (GB)

(72) Inventor: Denise Lee, Edinburgh (GB)

(73) Assignee: STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 0 days.

(21) Appl. No.: 15/476,108

(22) Filed: Mar. 31, 2017

(65) Prior Publication Data

US 2018/0083419 A1   Mar. 22, 2018

(30) Foreign Application Priority Data

Sep. 16, 2016   (EP) .................... 16189306

(51) Int. Cl.
*H01S 5/042* (2006.01)
*H01S 5/026* (2006.01)
*H01S 5/183* (2006.01)

(52) U.S. Cl.
CPC ............ *H01S 5/042* (2013.01); *H01S 5/0261* (2013.01); *H01S 5/183* (2013.01)

(58) Field of Classification Search
CPC .... H01S 5/042; H01S 5/0428; H01S 5/06808; H01S 5/0683
See application file for complete search history.

(56) References Cited

U.S. PATENT DOCUMENTS

| | | | |
|---|---|---|---|
| 5,123,023 A | 6/1992 | Santarelli et al. | |
| 5,936,986 A | 8/1999 | Cantatore et al. | |
| 6,026,104 A | 2/2000 | Itou | |
| 6,711,189 B1 | 3/2004 | Gilliland et al. | |
| 8,112,003 B2* | 2/2012 | Kozato | H04B 10/505 398/197 |
| 8,401,388 B2 | 3/2013 | Scandurra et al. | |
| 2002/0037020 A1* | 3/2002 | Shimura | H01S 5/0687 372/38.02 |
| 2002/0075919 A1* | 6/2002 | Tochio | H01S 5/042 372/38.02 |
| 2003/0035451 A1 | 2/2003 | Ishida et al. | |
| 2006/0072867 A1 | 4/2006 | Kawagishi | |
| 2006/0291512 A1 | 12/2006 | Borschowa | |
| 2015/0372451 A1* | 12/2015 | Fulkerson | H01S 5/0427 372/35 |

* cited by examiner

*Primary Examiner* — Michael Carter
(74) *Attorney, Agent, or Firm* — Slater Matsil, LLP

(57) ABSTRACT

A driver circuit is configured to pass a current. The circuit includes a first transistor connected in series with the laser diode, and configured to regulate the current. A voltage regulator is configured to provide an input to a gate of the first transistor so as to regulate the current in dependence upon a regulator input and a feedback input at the voltage regulator.

22 Claims, 7 Drawing Sheets

LASER DRIVER CIRCUIT AND METHOD OF OPERATING THEREOF

CROSS-REFERENCE TO RELATED APPLICATIONS

This application claims priority to European Patent Application No. 16189306.0, filed on Sep. 16, 2016, which application is hereby incorporated herein by reference.

TECHNICAL FIELD

Some embodiments relate to an apparatus and in particular but not exclusively to an apparatus for supplying current for laser diodes.

BACKGROUND

Circuits and methods of driving laser diodes (LD) such as vertical cavity surface emitting laser (VCSEL) diodes are known. Furthermore it is known that these circuits facilitate an efficient manner of producing lasing optical output power, primarily in the form of a pulse shape (commonly referred to as a pulsed train), but may also be in the form of an arbitrary waveform (such as a sine wave). These arbitrary waveforms may be defined by a continuous wave (CW) input.

The ability to drive the laser diode to generate a suitable continuous wave light intensity output has many applications. For example, generating a continuous wave light intensity output enables the laser diode to encode information for transmission within the optical output signal as well as enabling timed event detection.

Laser diode current supplies or current drivers produce an output which produces a signal or pulse shape having a defined rise time (Tr) and fall time (Tf). This rise and fall time defines a limit for pulse width and similarly for bandwidth of signaling. The rise and fall times of conventional laser diode current drivers is defined by the parasitic transistor capacitances within the circuits and the ability for the capacitances to charge/discharge based on the circuit arrangement.

Furthermore there are no conventional pulse current drivers which are able to feature arbitrary waveform generation by manner of a digital input and thus via a digital-to-analog (D/A) translation.

A further issue with conventional current drivers is one of driving current to the laser diode within the diode's linear range and furthermore being able to do so within the limitation of the driver circuit topology and supply voltage headroom.

Conventional laser diode driver circuit topology attempts to maintain that the laser diode current remains invariant to varying supply voltage levels, but limitations exist where, for levels in which the headroom limit is exceed, the laser diode output current range is no longer linear. This produces the effect of a tapering down of peak current. Furthermore this prevents linear granularity of control in output optical power and furthermore reproduction (D/A) of distortion free waveforms.

SUMMARY

According to a first aspect, a driver circuit for a laser diode is configured to pass a current. The circuit comprises a first transistor that is connected in series with the laser diode and is configured to regulate the current. A voltage regulator is configured to provide an input to the gate of the first transistor so as to regulate the current in dependence upon a regulator input and a feedback input at the voltage regulator.

In one embodiment, the voltage regulator comprises an operational amplifier.

In one embodiment, the regulator input of the operational amplifier is an inverting input, and the feedback input of the operational amplifier is a non-inverting input.

In one embodiment, the driver circuit further comprises a digital to analog converter configured to output an analog signal to the regulator input of the voltage regulator. The analog signal is based on a digital representation of a laser diode output level.

In one embodiment, the digital representation of a laser diode output level comprises a digital representation of: a continuous wave laser output; and a pulsed mode laser output.

In one embodiment, the driver circuit further comprises a shunt path arranged in parallel to the laser diode. The shunt path comprises a second transistor configured to regulate a current in the shunt path in dependence upon an input provided by the voltage regulator. One or more switches are configured to switch a flow of current between the laser diode and the shunt path.

In one embodiment, the driver circuit further comprises a resistor connected to the feedback input of the voltage regulator. The resistor is configured to simulate a voltage drop resulting from a linear response of the laser diode.

In one embodiment, the resistor is a trimmable resistor.

In one embodiment, the driver circuit further comprises a modelled voltage forward based voltage generator configured to provide an input to the regulator input.

In one embodiment, the modelled voltage forward based voltage generator comprises one or more forward biased diodes.

In one embodiment, the modelled voltage forward based voltage generator comprises one or more resistors.

In one embodiment, the driver circuit further comprises a clamp switch connected in parallel with the laser diode.

In one embodiment, the laser diode is configured to be operated within a linear region of operation.

In one embodiment, the laser diode is a vertical cavity surface emitting laser diode.

In one embodiment, the driver circuit further comprises a positive supply rail connected to the anode of the laser diode, and a negative supply rail connected to the cathode of the laser diode. The positive supply rail and negative supply terminal are configured to provide the current.

According to a second aspect, a method can be used for operating a driving circuit for a laser diode configured to pass a current. The method comprises regulating the current by a first transistor connected in series with the laser diode. An input is provided to the gate of the first transistor by a voltage regulator so as to regulate the current in dependence upon a regulator input and a feedback input at the voltage regulator.

In one embodiment, the voltage regulator comprises an operational amplifier.

In one embodiment, the regulator input of the operational amplifier is an inverting input, and the feedback input of the operational amplifier is a non-inverting input.

In one embodiment, the method further comprises: outputting by a digital to analog converter, an analog signal to the regulator input of the voltage regulator, wherein the analog signal is based on a digital representation of a laser diode output level.

In one embodiment, the digital representation of a laser diode output level comprises a digital representation of a continuous wave laser output, and a pulsed mode laser output.

In one embodiment, the method comprises: regulating by a second transistor in a shunt path, the current in the shunt path in dependence upon an input provided by the voltage regulator, and one or more switches configured to switch a flow of current between the laser diode and the shunt path. The shunt path is arranged in parallel to the laser diode.

In one embodiment, the method further comprises simulating, by a resistor, a voltage drop resulting from a linear response of the laser diode. The resistor is connected to the feedback input of the voltage regulator.

In one embodiment, the resistor is a trimmable resistor.

In one embodiment, the method further comprises: providing an input to the regulator input by a modelled voltage forward based voltage generator.

In one embodiment, the modelled voltage forward based voltage generator comprises one or more forward biased diodes.

In one embodiment, the modelled voltage forward based voltage generator comprises one or more resistors.

In one embodiment, the driver circuit further comprises: a clamp switch connected in parallel with the laser diode.

In one embodiment, the laser diode is configured to be operated within a linear region of operation.

In one embodiment, the laser diode is a vertical cavity surface emitting laser diode.

In one embodiment, the driver circuit further comprises: a positive supply rail connected to the anode of the laser diode; and a negative supply rail connected to the cathode of the laser diode, wherein the positive supply rail and negative supply terminal are configured to provide the current.

According to a third aspect, there is provided a driver circuit for a laser diode configured to pass a current, the circuit comprising: means for regulating the current; and means for providing an input to the means for regulating the current so as to regulate the current in dependence upon a regulator input and a feedback input.

BRIEF DESCRIPTION OF THE DRAWINGS

Some embodiments will now be described by way of example only and with reference to the accompanying Figures in which.

DETAILED DESCRIPTION OF ILLUSTRATIVE EMBODIMENTS

Figure 1B:
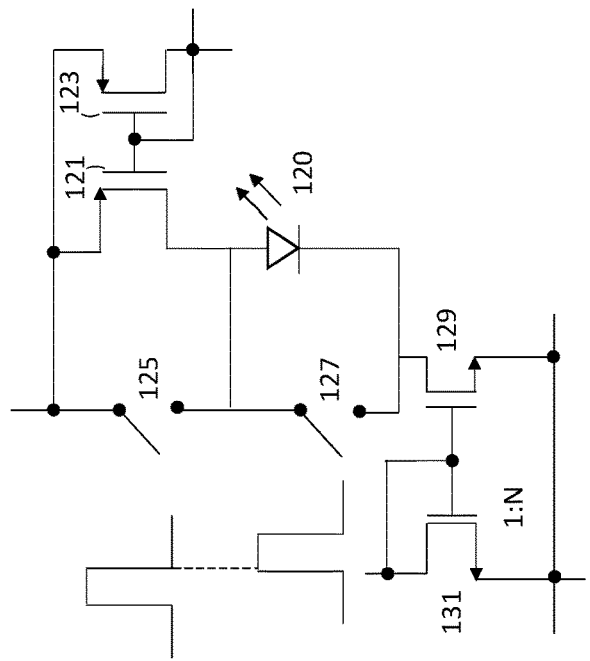
FIGS. 1a, 1b and 1c show a schematic view of a typical laser diode current driver configuration.

The concept as embodied herein is shown by apparatus and methods for controlling laser diode driver currents using a low impedance output device, such as an op-amp to regulate current driver transistors.

The circuit implementations shown herein are able to operate with headroom lower than conventional architecture and yet achieving matching tolerance of unary elements that are components of the digital-to-analog (D/A) conversion circuitry featured herein.

The following examples are shown as common source amplifiers with source-degeneration. In such examples the on-off switching of these elements, is representative of a digital code selection to analog current level translation, which forms the basis of a D/A converter (which may be implemented in the form of an Unary DAC) operation. This enables the granularity of lasing current control.

These embodiments thus enable both fast switching of the unary elements, as well as the enabling a simple implementation of switch drivers. They furthermore enable the use of process geometry feature shrink and the corresponding decrease in switching gate capacitance of the degenerate element.

In addition to the ease of switching these elements and the improvement in switching speed, the gate terminal of the switching transistors may be closed loop feedback controlled. The closed loop feedback firstly enables the reduction of output impedance of the common gate drive and secondly enables the maintenance of the set point of a programmed peak lasing current. Furthermore in some embodiments the closed loop control also enables the gate drive to be over-driven (Overdrive Mode). As the MOSFET device is operated between saturation and linear regions, the overdriving capability allows an extension of operating headroom, whilst maintaining the set point. In the overdrive mode, the laser diode driving operation transitions from 'switched current' to 'switched resistor' and is enabled to produce the pulsed train.

The aspect which is represented in the following embodiments it that of tracking a MOSFET device region of operation mimicking a likeness of an I/V transfer curve for the laser diode. The laser diode may be a vertical-cavity surface emitting laser (VCESL).

In order to more fully understand the advantages of the application we will first show and describe some known laser diode driver circuits. FIG. 1a, for example, shows an example known pulsed mode laser diode driver circuit (from the perspective of one half of a steered current unary pair, in other words the other half of the differential pair is not shown for simplicity). The laser diode 100 is coupled with its anode to the positive supply and the cathode to the current driver circuit. In the example shown in FIG. 1a the circuit is provided with a clamp switch 113 in parallel with the laser diode 100.

The driver circuit shown in FIG. 1a shows a cascode arrangement with a cascode transistor 103 coupled to the laser diode and which is coupled to a current switch in for current steering and which is coupled to a current sink transistor 107 which is then coupled to the negative supply rail. The cascode transistor 103 is coupled by its gate to a mirrored cascode transistor 101, which is configured to mirror the current from the mirrored cascode transistor 101 to the cascode transistor 103 on a 1:N ratio. The current sink transistor 107 is also coupled by its gate to a mirrored current sink transistor 105, which is configured to mirror the current from the mirrored current sink transistor 105 to the current sink transistor 107 on a 1:N ratio also. In this circuit by operating the current switch 111 a pulse of current defined by the current sink transistor 107 can be provided to the laser diode.

Figure 1A:
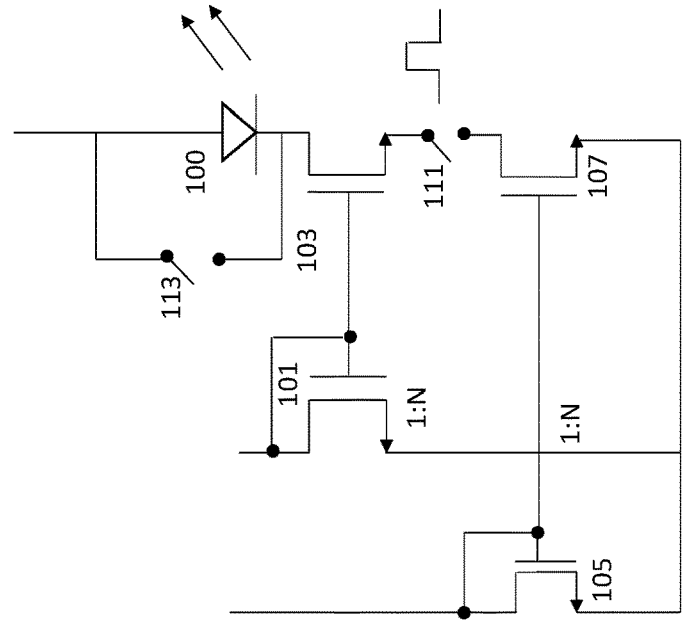

Furthermore with respect to FIG. 1b a further known pulse mode laser diode driver circuit is shown. In this example circuit the cascode transistors shown in FIG. 1a are replaced with a pre-bias transistor pair 121, 123. The laser diode 120 is coupled with its anode to the pre-bias transistor pair 121, 123 and the cathode to the current sink transistor 129 which is mirrored by the mirrored current sink transistor 131. In the example shown in FIG. 1b the circuit is provided with a clamp switch 127 in parallel with the laser diode 120. The driver circuit shown in FIG. 1b shows the pre-bias transistor pair arrangement with a first pre-bias transistor 121 coupled to the laser diode and the positive supply rail and which is in parallel with a current switch 125. The first pre-bias transistor 121 is coupled by its gate to a mirrored pre-bias transistor 131 which mirrors the current from on defined ratio. The circuit is configured to be operated by sequentially closing the current switch 125 and then the clamp switch 127 to provide the laser diode with a pulse of current in order to produce the required output light intensity.

Figure 1C:
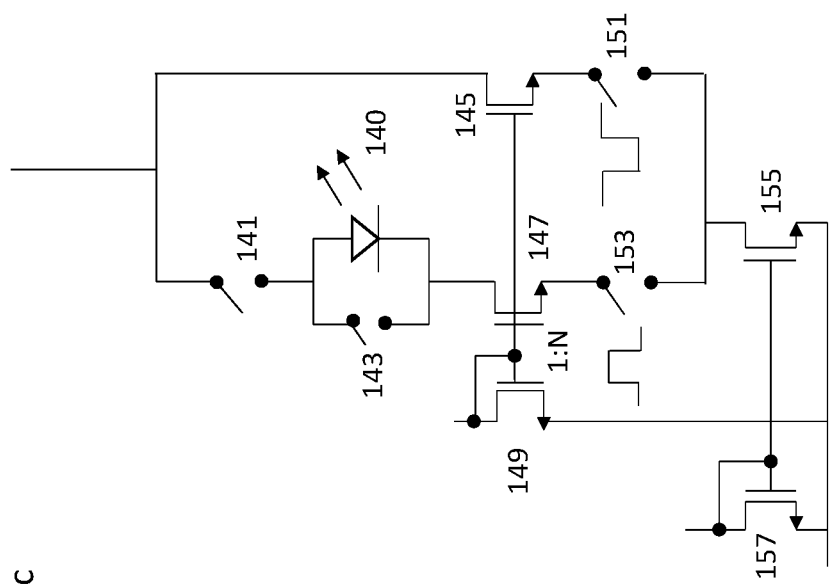

As well as being able to provide a current suitable for generating a current pulse a 'sine wave' current driver can be implemented. FIG. 1c shows a unary branch of a known sine wave mode circuit. In the circuit shown in FIG. 1c the laser diode 140 is shown with an associated clamp switch 143 in parallel with the laser diode 140. The laser diode 140 further is coupled to the positive supply rail via an operational switch 141 which is configured to be closed while the circuit is operational. The driver circuit shown in FIG. 1c further shows an arrangement similar to FIG. 1a (but furthermore shows both switch paths for the unary DAC configuration) with a cascode transistor 147 coupled to the laser diode 140 and a current switch 153. The circuit further shows a current sink transistor 155 which is coupled to the current switch 153 and the negative supply rail.

In parallel with the laser operational switch 141, the laser diode 140, the cascode transistor 147 and the current switch 153 is a further cascode transistor 145 and a further current switch 151 configured to provide the switch current path when the switch current path though the diode is not active.

The cascode transistor 147 is common gate coupled to the further cascode transistor 145 and to a mirrored cascode transistor 149. The mirrored cascode transistor 149 is configured to mirror the current from the mirrored cascode transistor 149 to the cascode transistor 147 (and to the further cascode transistor 151) on a 1:N ratio. The current sink transistor 155 is also common gate coupled to a mirrored current sink transistor 157 which mirrors the current from the mirrored current sink transistor 157 to the current sink transistor 155 on a 1:N ratio. An arbitrary wave may be generated by combining several of the driver circuits in parallel and by operating the switches 151 and 153 to selectively change the sink current experienced by the diode 140.

In such circuits the operation of the current steering switches 153 and 151 enable the switching on or off of the laser diode. However such circuits as shown in FIGS. 1a to 1c have problems as have been raised earlier.

The circuits such as shown in FIGS. 1a and 1c, by implementing a cascode arrangement in order to control Vdrain bias variation, have a switch rise and fall time which is defined by a parasitic gate capacitor $C_g$ and the bias current $I_{bias}$ of the current sink transistor. Furthermore the operating headroom of the cascode arrangement requires an operating voltage of Vov for both the cascode transistor. Vov is the excess voltage of a MOSFET device (its Drain Source voltage) for which its mode of operation is in Saturation region.

The concept as implemented in embodiments shown herein is to provide a laser diode driver implementation which displaces the cascode transistors but enables matching to be performed using a suitable closed loop feedback circuit and which controls the current sink transistors via a suitable low impedance output.

Figure 2:
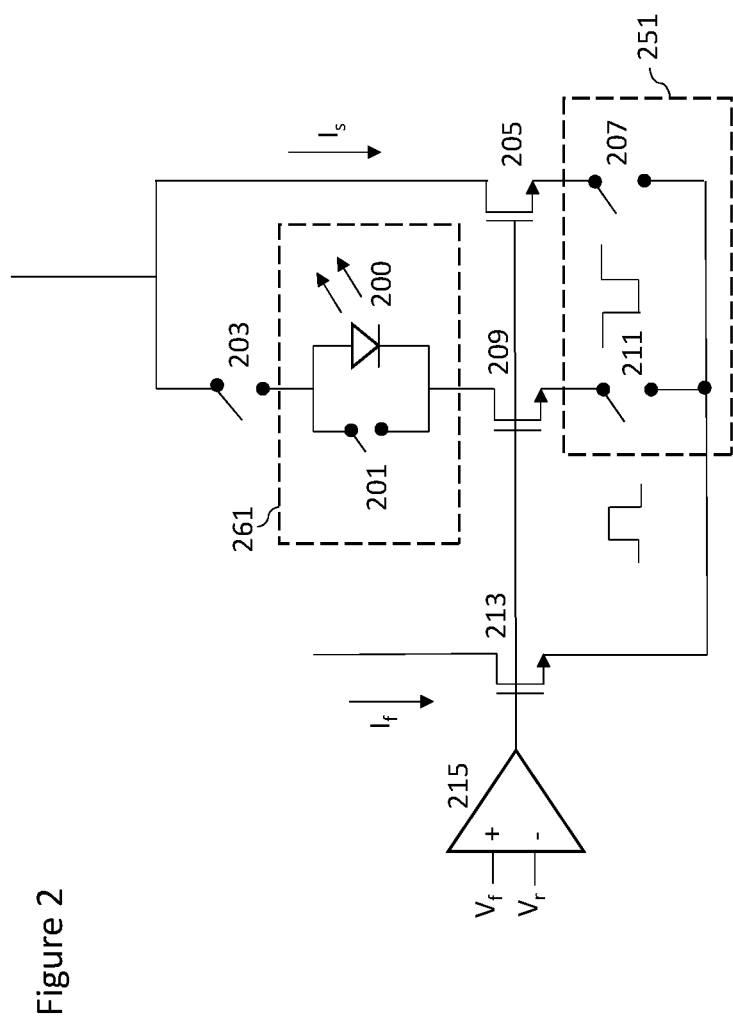
FIG. 2 shows a schematic view of a laser diode current driver configuration according to some embodiments.

FIG. 2 shows an example implementation for a driver circuit which shows an embodiment of the laser diode driver concept. FIG. 2 shows a modified version of the laser diode driver circuit shown in FIG. 1c. In this circuit the operational switch 203 is coupled to the parallel arrangement of the laser diode 200 and clamp switch 201. The laser diode 200 may be coupled to a current sink transistor 209 which in turn is coupled to a first current steering switch 211 and which is in turn coupled to the negative supply rail. A current switch or shunt path shown by the arrow $I_S$ and which is arranged in parallel with the operating switch 203, laser diode 200 and current sink transistor 209 comprises a further current sink transistor 205 which is coupled to the positive supply rail and a second current steering switch 207, which is in turn coupled to the negative supply rail.

The current sink transistor 209 and further current sink transistor 205 are gate coupled to a feedback transistor 213 which is configured to pass a feedback current $I_f$. The feedback transistor 213, the current sink transistor 209 and the further current sink transistor 205 are furthermore driven or coupled to the low impedance output of an operational amplifier 215. The operational amplifier 215 is configured to receive at a positive input a feedback voltage $V_f$ and further configured to receive at the negative input a reference voltage $V_r$.

Figure 3:
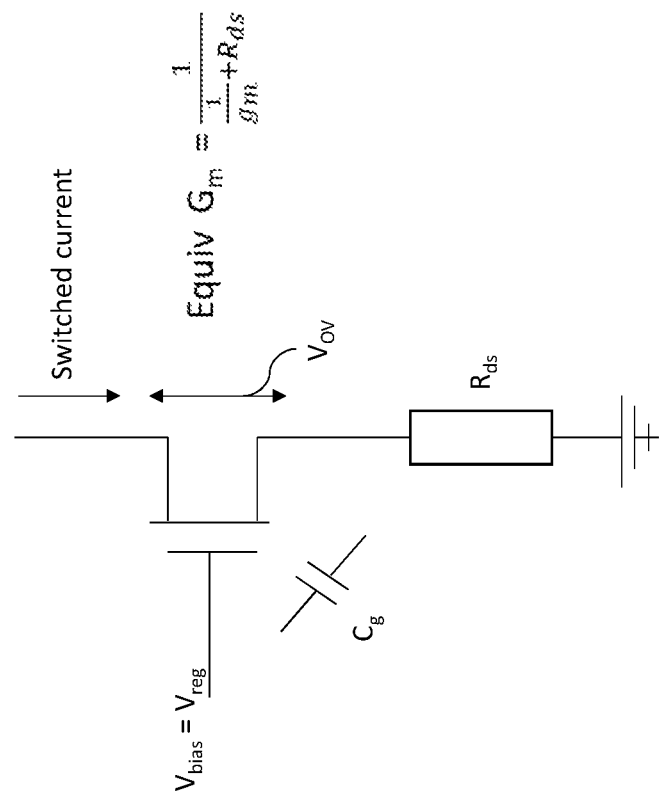
FIG. 3 shows a schematic view of a signal model of the laser diode current driver configuration as shown in FIG. 2.

An advantage of a circuit such as shown in FIG. 2 is shown by a signal model at the current sink transistor 209 and the current steering switch 211 shown in FIG. 3. From the signal model it can be seen that the rise and fall times of the switching of the circuit are controlled by the gate capacitance $C_g$ and the current which flows through the modelled ON resistance, $R_{ds}$. Furthermore the $C_g$ charge/discharge is performed via the resistor $R_{ds}$ and as such is defined by a $dv/dt=R_{ds}*C_g$ and not the current source such as shown in FIG. 1c which causes a $dv/dt=I_{bias}/C_g$. $R_{ds}$ may be a MOSFET on small geometry process (e.g. 40 nm). Such a MOSFET may present both reduction in switching gate capacitance and can be driven at native logic level (e.g. 1.1V, hence the ease of using standard logic cells as pre-drivers), also doing away with the need for level shifting, which impedes frequency of switching.

An additional advantage of such a circuit is that the switching can be filtered via a separate supply voltage (coupled to the feedback current supply) which can reduce fluctuations on the positive supply rail for the laser diode.

As also discussed the removal of the cascode transistor improves the operating headroom for the circuit. In order to enable or redeem this benefit the transistors should be operated in saturation modes.

In order to generate a suitable regulation voltage for the laser diode the feedback loop attempts to simulate the operation of the laser diode for the current value driving the laser diode.

In applications where the laser diode emits light of IR wavelength, a semiconductor material like Gallium Arsenide (GaAs) is commonly utilized. A model equivalent for GaAs for a forward biased voltage (Vf) may be approximated as two silicon (Si) diode drop. IR wavelengths are used because they are invisible to the human eye and thus may be implemented in applications such as communications where visibility is not desired perception. Although the approximation is described herein with respect to GaAs other semiconductor PN junctions may be approximated in some other embodiments (for example Homo-junction Si).

Furthermore in order to simulate or model the current response of the laser diode it may be assumed that the laser diode (e.g. a VCSEL) is to be operated within the linear region of operation. This occurs when the diode is operated in the linear optical power output region above the pre-bias knee region at Ith, where it bounds the extinction of optical output power.

As the optical power against current curve is intrinsic to the device structure may be modelled by the mesa resistance $R_s$ which comprises the resistances from the P and N-Type distributed Bragg Reflector Mirrors, the sheet resistance from the n-contact layer and the P- and N-contacts and aperture of lasing window. In other words the feedback loop may model the current required for the laser diode to generate a light intensity value by using a resistor value $R_s$.

Furthermore by modelling the values in the following manner it is possible to model the change of proportionality with respect to absolute temperature (Complementary, CTAT).

Figure 4A:
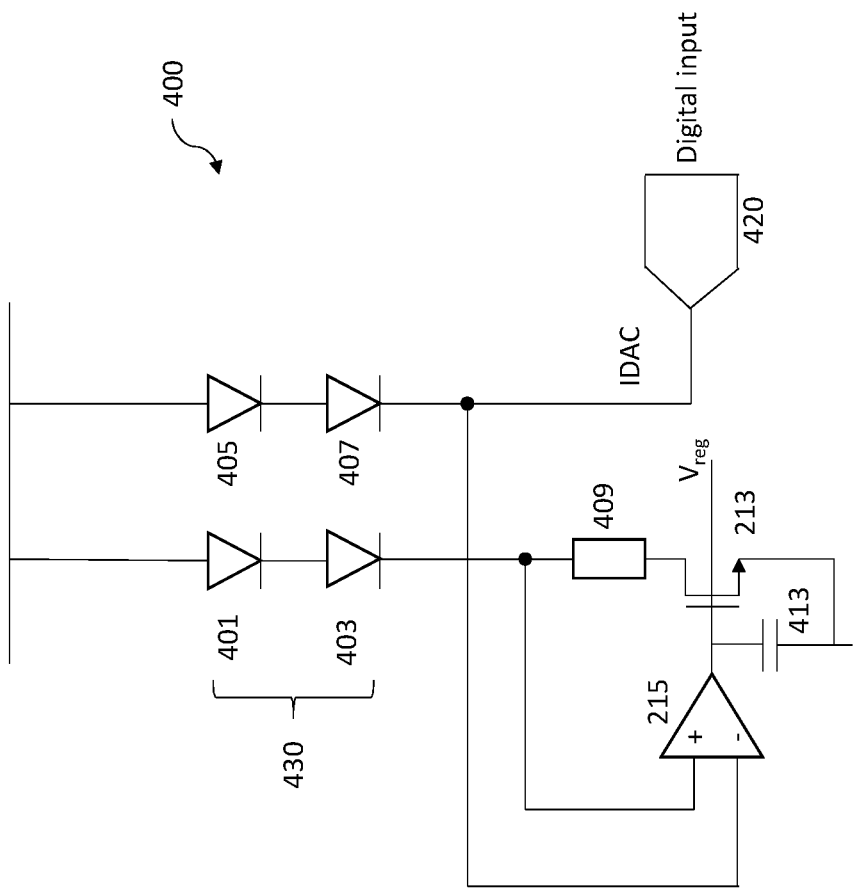
FIG. 4a shows a schematic view of feedback current generating circuit with digital to analog generating capacity according to some embodiments.

An example of the generation of the reference and feedback voltage values which may be input to the operational amplifier 215 are shown in FIG. 4a. FIG. 4a shows circuitry 400 comprising a modelled voltage forward based voltage generator 430 comprising a pair of forward biased diodes 405 and 407 in series between the positive supply rail and the regulator input. The circuitry may additionally include resistors 415 and 417 between the positive supply rail and diodes 430. Furthermore FIG. 4a shows the anode of the diode 407 which is driven by an output voltage from a digital-to-analog (DAC) converter 420. The DAC 420 can receive a digital input value which then outputs a suitable current output $I_{DAC}$ which impacts on the reference voltage input to the negative input of the operational amplifier 215.

The feedback voltage generator part of the circuitry 400 comprises a further modelled voltage forward based voltage generator comprising a further pair of forward biased diodes 401 and 403 in series between the positive supply rail and the feedback input (the positive input of the operational amplifier 215). The feedback input is further coupled to a 'golden' resistor 409 which is configured to simulate the voltage drop caused by the linear response of the laser diode ($R_s$). The 'golden' resistor 409 is then coupled to the drain of the feedback transistor 213. In some embodiments the output of the operational amplifier 215 is coupled to the negative supply rail by a decoupling capacitor 413.

In such a manner a scaled equivalent to the peak DC level of the lasing current can be generated or 'programmed' by using a current DAC. This circuit thus generates a set point voltage using the two forward biased Si diodes, for which the Operational Amplifier then generates the regulate voltage ($V_{REG}$) and which is output and common gated to the elements such as shown in FIG. 2 and furthermore with then used by the feedback loop by a referencing or 'golden unit' element. The 'golden' unit, which in FIG. 4a is shown as the resistor 409 generates a model drain-source current ($I_{DS}$) and which is a ratio of the desired (or programmed) current (e.g. in this example a ratio of 1:1).

Furthermore in such embodiments the peak lasing current (or Full Scale, FS) is amplified by gains obtained by the open-loop current mirroring ratio of the golden unit to the summed unit elements that make up the unary DAC.

In such embodiments it may be possible to overdrive VREG, as the MOSFET device goes from saturation to linear mode with an increasing of lasing current and thus in some embodiments enable an extension of operating supply range (the headroom limitation) with a set peak lasing current.

The use of the feedback/tracking mechanism may in some embodiments be configured to be adjustable, for example by trimming the 'golden' resistor value for correction.

Figure 4B:
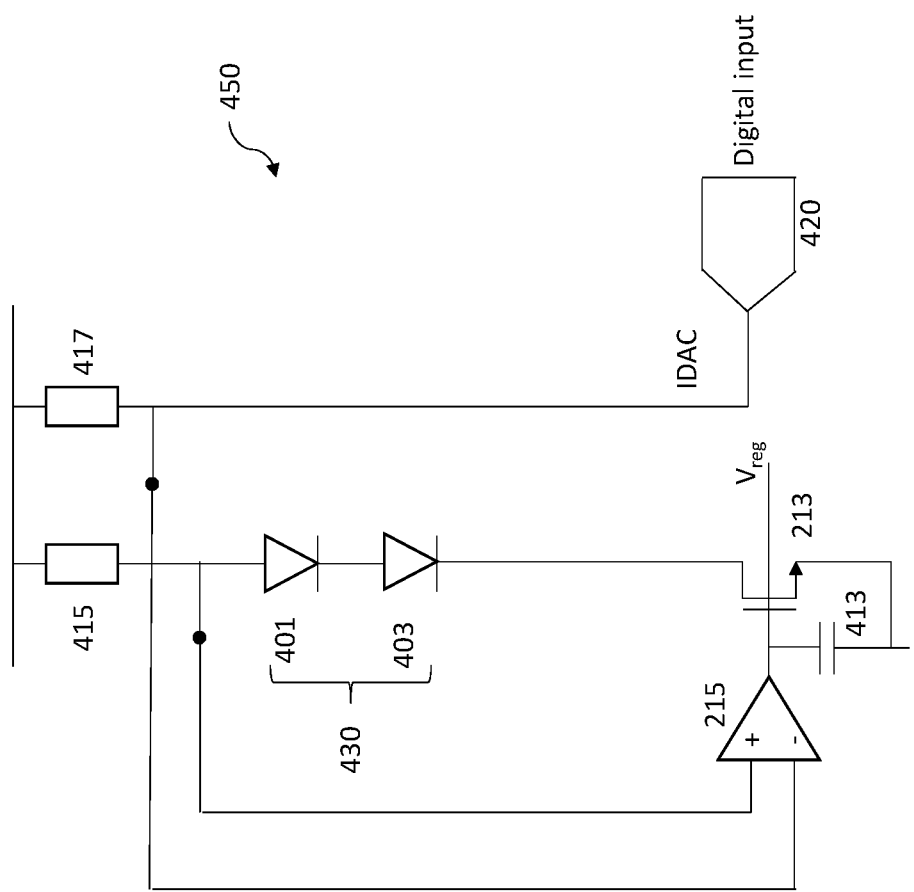
FIG. 4b shows a schematic view of feedback current generating circuit with digital to analog generating capacity according to other embodiments.

A further example of a circuit 450 for the generation of the reference and feedback voltage values which may be input to the operational amplifier 215 are shown in FIG. 4b. This example circuit is similar to the circuit shown in FIG. 4a and like reference numerals refer to like circuit components. The circuit additionally includes a pair of resistors 415, 417. Resistor 415 is connected in series between the positive supply rail and the diodes 401, 403. Resistor 417 is connected between the positive supply rail and the regulator input. Resistor 417 may also be connected to the IDAC.

Figure 5:
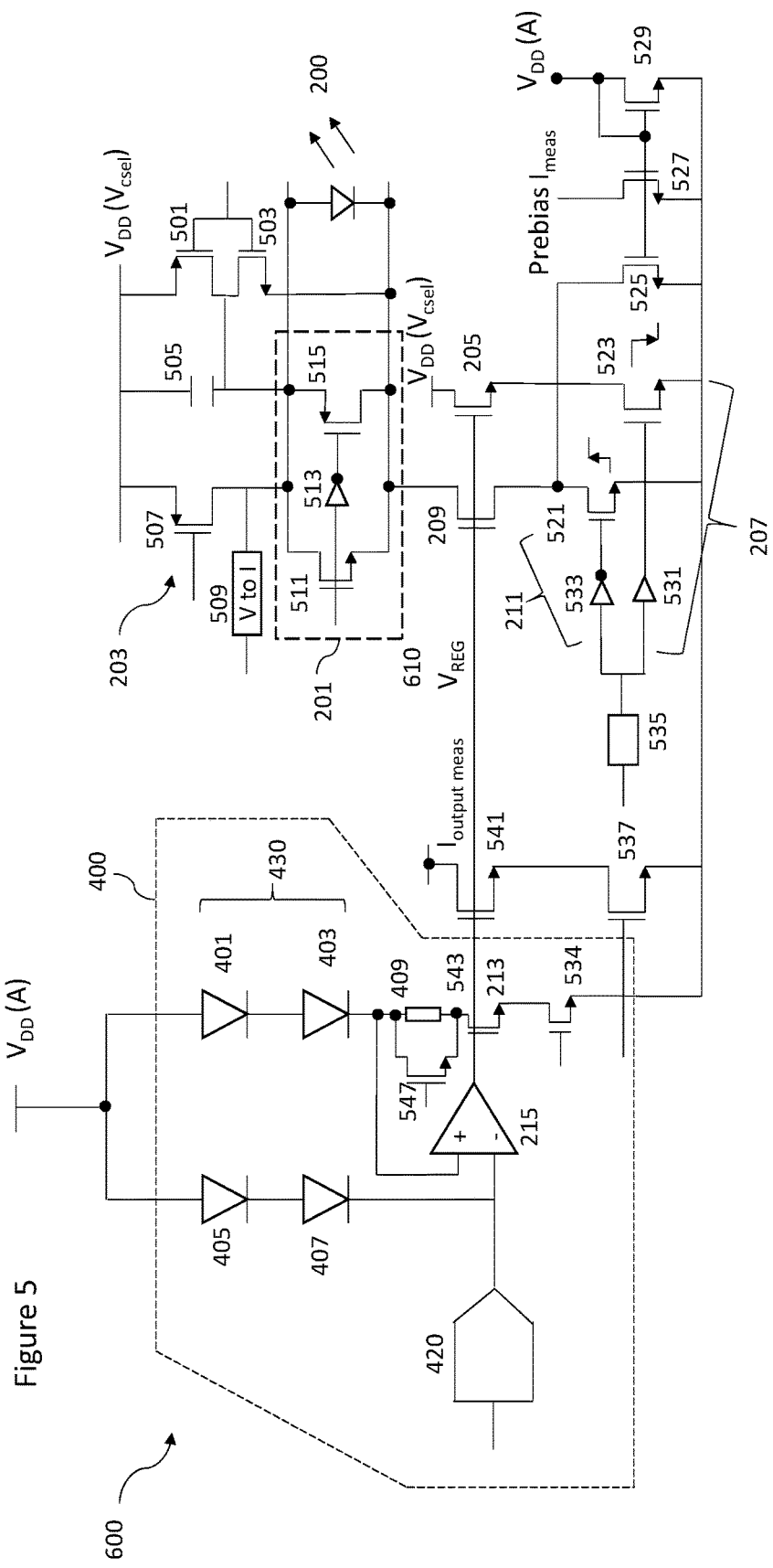
FIG. 5 shows a schematic view of the laser diode current driver configuration as shown in FIGS. 2, 4a and 4b.

With respect to FIG. 5 the implementation examples shown in FIGS. 2 and 4 are integrated into a top level schematic view of a laser diode circuit 600.

The laser diode circuit in this example comprises the regulation voltage generator 400 which comprises a modelled voltage forward based voltage generator 430 comprising a pair of forward biased diodes 405 and 407 in series between the positive supply rail and the regulator input, the anode of the diode 407 which is driven by an output voltage from a digital-to-analog (DAC) converter 420, a further modelled voltage forward based voltage generator comprising a further pair of forward biased diodes 401 and 403 in series between the positive supply rail and the feedback input (the positive input of the operational amplifier 215). The feedback input is further coupled to a 'golden' element in the form of resistor 409 which is configured to simulate the voltage drop caused by the linear response of the laser diode (Rs) and the transistor 547 in parallel with the resistor which may simulate the non-linear voltage drop of the laser diode when not in the linear response region. The 'golden' element resistor 409 is then coupled to the drain of the feedback transistor 213. The circuit is shown further comprising a further transistor 534 coupled between the source of the feedback transistor 213 and the negative supply rail which simulates the effect of the current steering switches.

The current driver is further shown with the current steering switches 211 and 213 as shown in FIG. 2 implemented as transistors 521 and 523 which are driven via pre-drivers and which receive inputs from a decoder 535 which receives the digital to analog converter input and switches between the diode and shunt current switch paths.

Furthermore the circuit is shown with a pre-bias module which comprises transistors 525, 527 and 529.

The clamp switch 201 is shown implemented as a switch input which is coupled to the gate of an NMOS transistor 511 and to the input of an inverter 513, the output of which is further coupled to the gate of a PMOS transistor 515, where the NMOS and PMOS transistors are coupled in parallel with the laser diode 200.

The operational switch 203 is shown implemented as a transistor 507 coupled between the positive supply rail and the laser diode 200.

A current monitor in the form of a voltage to current converter 509 is shown coupled to the laser diode and furthermore a current measurement may be provided by a transistor 541 gate coupled to the output of the operational amplifier and further enabled by a measurement selector transistor 537.

Furthermore the circuit is shown with a clock/pulse snubber comprising complimentary transistors 501 and 503 and capacitor 505. This is another patent disclosure that's placed on hold, its benefit is yet to be evaluated on silicon, it decreases the fall time Tf of the pulse negative edge.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A driver circuit for a laser diode configured to pass a current, the driver circuit comprising:
    a first transistor connected in series with the laser diode, the first transistor being configured to regulate the current; and
    a voltage regulator configured to provide an input to a gate of the first transistor so as to regulate the current in dependence upon a regulator input and a feedback input at the voltage regulator, wherein the voltage regulator comprises an operational amplifier and a feedback transistor, wherein an output of the operational amplifier is connected to both a gate of the feedback transistor and the gate of the first transistor.

2. The driver circuit as claimed in claim 1, wherein the regulator input of the operational amplifier is an inverting input, and the feedback input of the operational amplifier is a non-inverting input.

3. The driver circuit as claimed in claim 1, further comprising a digital to analog converter configured to output an analog signal to the regulator input of the voltage regulator, wherein the analog signal is based on a digital representation of a laser diode output level.

4. The driver circuit as claimed in claim 3, wherein the digital representation of a laser diode output level comprises a digital representation of a continuous wave laser output.

5. The driver circuit as claimed in claim 3, wherein the digital representation of a laser diode output level comprises a pulsed mode laser output.

6. The driver circuit as claimed in claim 1, further comprising
    a shunt path arranged in parallel to the laser diode, the shunt path comprising a second transistor configured to regulate a current in the shunt path in dependence upon an input provided by the voltage regulator; and
    a switching circuit configured to switch a flow of current between the laser diode and the shunt path.

7. The driver circuit as claimed in claim 1, further comprising a resistor connected to the feedback input of the voltage regulator, wherein the resistor is configured to simulate a voltage drop resulting from a linear response of the laser diode.

8. The driver circuit as claimed in claim 1, further comprising a modelled voltage forward based voltage generator configured to provide an input to the regulator input.

9. The driver circuit as claimed in claim 8, wherein the modelled voltage forward based voltage generator comprises one or more forward biased diodes.

10. The driver circuit as claimed in claim 8, wherein the modelled voltage forward based voltage generator comprises one or more resistors.

11. The driver circuit as claimed in claim 1, further comprising a clamp switch connected in parallel with the laser diode.

12. The driver circuit as claimed in claim 1, wherein the laser diode is configured to be operated within a linear region of operation.

13. The driver circuit as claimed in claim 1, wherein the laser diode is a vertical cavity surface emitting laser diode.

14. The driver circuit as claimed in claim 1, further comprising:
    a positive supply rail connected to an anode of the laser diode; and
    a negative supply rail connected to a cathode of the laser diode, wherein the positive supply rail and negative supply terminal are configured to provide the current.

15. A method for operating a driving circuit for a laser diode configured to pass a current, the method comprising:
    causing a current to flow through the laser diode, wherein a first transistor is connected in series with the laser diode;
    generating a feedback signal at an input of an operational amplifier, wherein an output of the operational amplifier is connected to a first control input of the first transistor and to a feedback control input of a feedback transistor;
    generating a regulation signal based on a representation of a laser diode output level and the feedback signal dependent upon the regulation signal; and
    regulating the current through the laser diode by applying the regulation signal to the first control input of the first transistor.

16. The method as claimed in claim 15, wherein generating the regulation signal comprises generating the regulation signal based on an analog signal that is based on a digital representation of the laser diode output level.

17. The method as claimed in claim 16, generating a regulation signal comprises generating the regulation signal based upon a scaled equivalent of the current flowing through the laser diode using the analog signal that is based on the digital representation of the laser diode output level.

18. The method as claimed in claim 15, further comprising regulating the current through the laser diode by causing a portion of the current to be shunted around the laser diode.

19. A circuit comprising:
    a laser diode;
    a transistor having a current path coupled in series with the laser diode;
    an operational amplifier having an output coupled to a control input of the transistor;
    a digital to analog converter having an output coupled to a first input of the operational amplifier and an input coupled to receive a digital representation of a laser diode output level;
    a feedback transistor having a control input configured to receive the output of the operational amplifier; and
    a resistor having a current path coupled in series with the feedback transistor and a second input of the operational amplifier.

20. The circuit as claimed in claim 19, further comprising:
    a power supply node;
    a first diode coupled between the power supply node and the second input of the operational amplifier; and
    a second diode coupled between the power supply node and the first input of the operational amplifier.

21. The circuit as claimed in claim 19, further comprising a shunt path arranged in parallel to the laser diode.

22. A driver circuit for a laser diode configured to pass a current, the driver circuit comprising:
- a first transistor connected in series with the laser diode, the first transistor being configured to regulate the current;
- a voltage regulator configured to provide an input to a gate of the first transistor so as to regulate the current in dependence upon a regulator input and a feedback input at the voltage regulator; and
- a resistor connected to the feedback input of the voltage regulator, wherein the resistor is configured to simulate a voltage drop resulting from a linear response of the laser diode.

* * * * *